(12) United States Patent
Gu et al.

(10) Patent No.: US 8,990,739 B2
(45) Date of Patent: Mar. 24, 2015

(54) MODEL-BASED RETIMING WITH FUNCTIONAL EQUIVALENCE CONSTRAINTS

(71) Applicant: The MathWorks, Inc., Natick, MA (US)

(72) Inventors: Yongfeng Gu, Brookline, MA (US); Girish Venkataramani, Boston, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/096,333

(22) Filed: Dec. 4, 2013

(65) Prior Publication Data

US 2014/0157218 A1 Jun. 5, 2014

Related U.S. Application Data

(60) Provisional application No. 61/733,255, filed on Dec. 4, 2012, provisional application No. 61/787,445, filed on Mar. 15, 2013.

(51) Int. Cl.
*G06F 17/50* (2006.01)

(52) U.S. Cl.
CPC .......... *G06F 17/5081* (2013.01); *G06F 17/504* (2013.01); *G06F 17/505* (2013.01); *G06F 17/5022* (2013.01)
USPC ........... 716/103; 716/104; 716/105; 716/106; 716/111; 716/132; 703/16

(58) Field of Classification Search
CPC . G06F 17/5022; G06F 17/504; G06F 17/505; G06F 17/5081
USPC ................. 716/103, 104, 105, 106, 111, 132; 703/16
See application file for complete search history.

(56) References Cited

U.S. PATENT DOCUMENTS

| | | | | |
|---|---|---|---|---|
| 4,748,439 | A * | 5/1988 | Robinson et al. | 340/146.2 |
| 5,313,615 | A * | 5/1994 | Newman et al. | 716/139 |
| 5,369,593 | A * | 11/1994 | Papamarcos et al. | 716/136 |
| 5,648,920 | A * | 7/1997 | Duvvury et al. | 716/50 |
| 5,864,487 | A * | 1/1999 | Merryman et al. | 716/108 |
| 6,671,846 | B1 * | 12/2003 | Schultz | 714/741 |
| 6,738,677 | B2 * | 5/2004 | Martin et al. | 700/44 |
| 7,127,384 | B2 * | 10/2006 | Zolotov et al. | 703/14 |
| 7,243,322 | B1 * | 7/2007 | Ly et al. | 716/108 |

(Continued)

OTHER PUBLICATIONS

Leiserson, Charles E. and Saxe, James B., "Optimizing synchronous systems" (Jan. 1, 1982). *Computer Science Department*. Paper 2429. http://repository.cmu.edu/compsci/2429, 30 pages.

(Continued)

*Primary Examiner* — Phallaka Kik
(74) *Attorney, Agent, or Firm* — Cesari and McKenna, LLP

(57) ABSTRACT

A system and method tests for functional equivalence prior to automatically retiming a high-level specification. An Intermediate Representation (IR) includes one or more graphs or trees based on the high-level specification. A functional equivalence (FE) analyzer determines whether one or more components in the graph meet certain value and state conditions and thus is a candidate for retiming. A bounded scheduler then retimes only those components that pass the FE analysis.

24 Claims, 17 Drawing Sheets

(56) References Cited

U.S. PATENT DOCUMENTS

| | | | |
|---|---|---|---|
| 7,454,324 B1* | 11/2008 | Seawright et al. | 703/14 |
| 7,487,077 B1* | 2/2009 | Clune et al. | 703/17 |
| 8,402,449 B1 | 3/2013 | Biswas et al. | |
| 8,584,064 B2* | 11/2013 | Matsuda | 716/106 |
| 2003/0078684 A1* | 4/2003 | Martin et al. | 700/44 |
| 2004/0044510 A1* | 3/2004 | Zolotov et al. | 703/14 |
| 2006/0080626 A1* | 4/2006 | Ohba et al. | 716/6 |
| 2012/0131536 A1* | 5/2012 | Kitazawa | 716/136 |

OTHER PUBLICATIONS

Leiserson, Charles E. and Saxe, James B., "Retiming Synchronous Circuitry" (Aug. 20, 1986) Systems Research Center of Digital Equipment Corporation, Palo Alto, CA, 56 pages.

Van Antwerpen, Babette et al., "A Safe and Complete Gate-Level Register Retiming Algorithm" from "IWLS 2003 Twelfth Annual Workshop on Logic and Sythesis" May 28-30, 2003, 8 pages.

Retiming, from Wikipedia, the free encyclopedia, Nov. 27, 2012, en.wikipedia.org/wiki/Retiming, 3 pages.

* cited by examiner

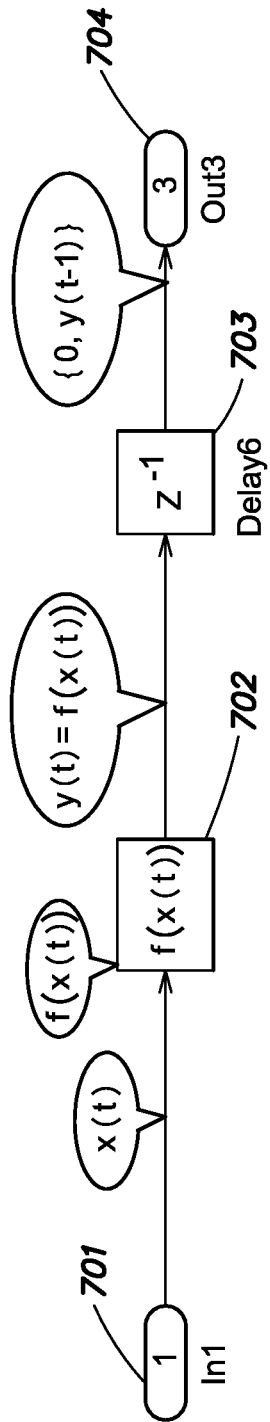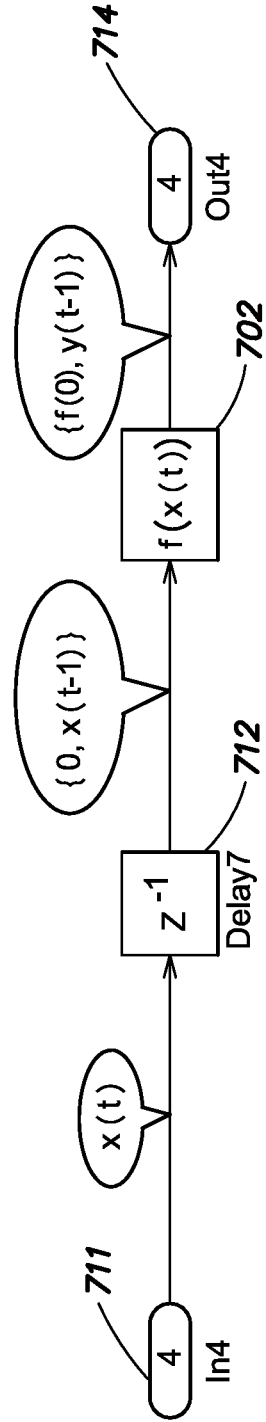
FIG. 7A
FIG. 7B

901 — * States have 0 as initial values.
902 — * f(0) = 0.
903 — * 0 at input does not change the component's state.

MODEL-BASED RETIMING WITH FUNCTIONAL EQUIVALENCE CONSTRAINTS

CROSS REFERENCE TO RELATED APPLICATION(S)

This application claims the benefit of U.S. Provisional Patent Application Ser. No. 61/733,255 filed on Dec. 4, 2012 entitled "Model-Based Optimization with Functional Equivalence Constraints" by Yongfeng Gu and Girish Venkataramani, and U.S. Provisional Patent Application No. 61/787,445 filed on Mar. 15, 2013 entitled "Model-Based Retiming with Functional Equivalence Constraints" by Yongfeng Gu and Girish Venkataramani, the entire contents of each of which are incorporated by reference herein.

BACKGROUND

One goal of circuit design and/or program coding is to optimize some aspect of a system with the goal of improving its quality. One such optimization approach, generally referred to as the retiming of a circuit, is a technique of moving the structural location of latches or registers in a digital circuit in order to improve performance, area, and/or power consumption in such a way that preserves behavior at the circuit's outputs. Automated techniques use a directed graph to represent the digital circuit under consideration, where the vertices of the graph represent asynchronous combinational blocks, and directed edges of the graph represent a series of synchronous registers or latches. Each vertex has a value corresponding to the delay through the combinatorial circuit. After constructing this representation, one can attempt to optimize the circuit by moving delay registers around from input to the output or vice versa.

BRIEF DESCRIPTION OF THE DRAWINGS

The description below refers to the accompanying drawings, of which:

FIGS. 7A and 7B are graphical views of an example constraint applied to provide functional equivalence;

DETAILED DESCRIPTION OF AN ILLUSTRATIVE EMBODIMENT

Figure 1:
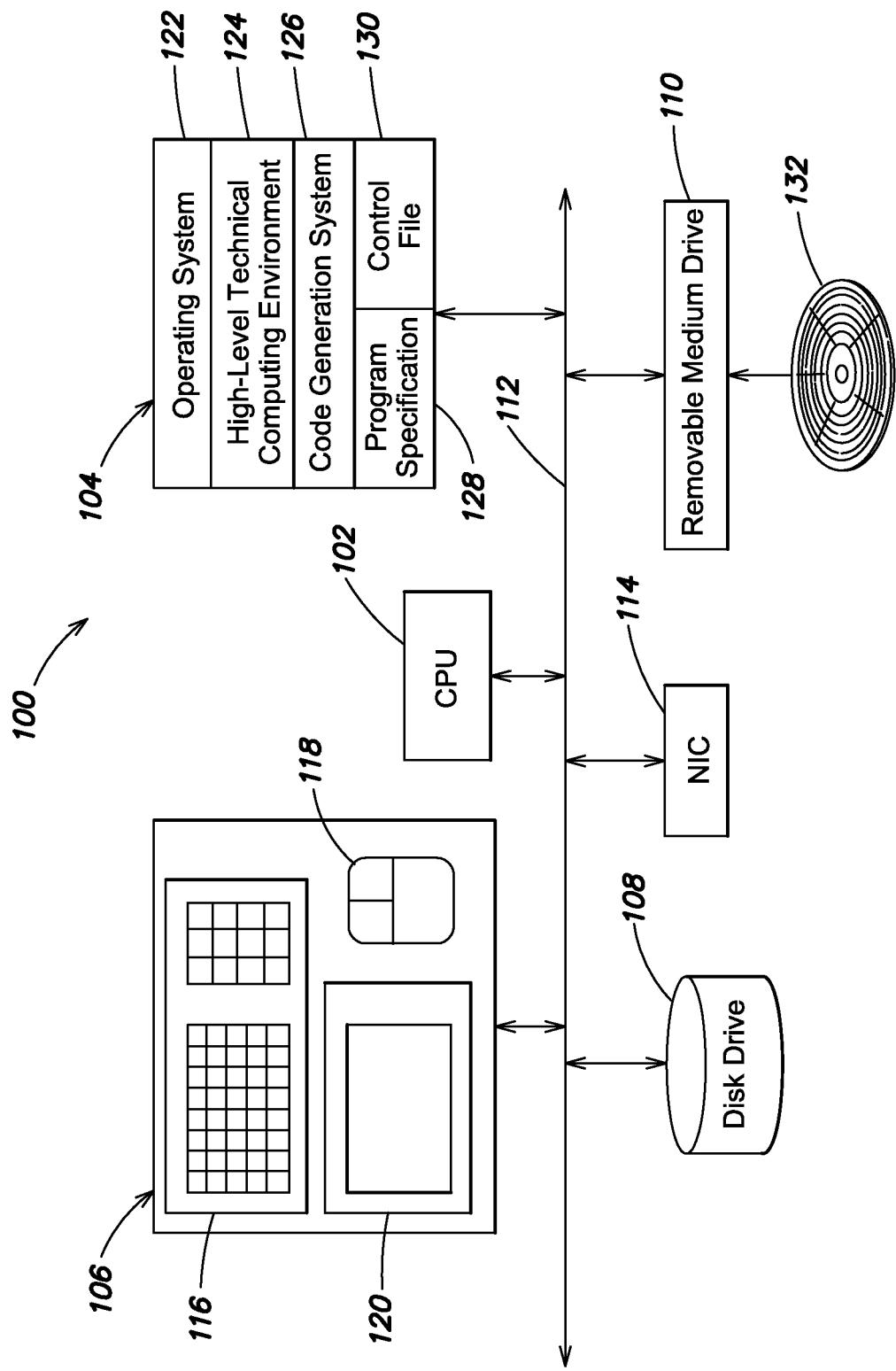
FIG. 1 is a high level diagram of an example data processing platform on which the present system and methods may be implemented.

A system and method for optimizing code, such as in one example, a hardware description language (HDL) code representation of a functional element such as a circuit, is generated from a program model created within a high-level development environment. Tools are provided for retiming or other optimization of the model, such as applying register pipelining to achieve retiming.

In one or more present approaches, an additional functional constraint is introduced to the model-based retiming of the design. In particular, a functional equivalence constraint is introduced to the design synthesis and made a top priority constraint. The functional equivalence constraint provides that a modified model of a component has the same functionality as the original model. Once the functional equivalence constraint is satisfied, then other constraints such as pipeline retiming and so forth can then be applied to the model.

In some embodiments, the functional constraint analyzes three conditions for a component of a graph to determine if functionally equivalent retiming is possible for the component (such as by moving a register across the component). These can include:

states internal to the component having zero as an initial value {initVal=0} zero input produces a zero output {f(0)=0} zero input does not result in changed internal states

The functional equivalence analysis can be implemented in several ways. For primitive components, the semantics may be well known in advance. Information concerning functional equivalence can be readily determined or even stored within the model for these components. For example, a simple logical component such as a gain amplifier block is known to accept a zero input, to provide zero output in response to a zero input, and to not have any state changes given zero at the input. Therefore a gain component can be marked to satisfy the functional equivalence condition. On the other hand, a component such as a counter will change its state in response to clock signals, and thus will not pass the functional equivalence test. In still other instances, a logical inverter may prevent zero output.

For more complex blocks, an initial value propagation based test can check for state changes. The tools can apply input conditions to test the component to determine if an internal state changes with a zero input applied, and if not, will report that it is safe to move a delay block across. However, if states do change with an applied input, then a conclusion can be reached that is unsafe to move a delay register across the component. It can be sufficient to test such components for compliance with zero, non-zero, and unknown inputs, and exhaustive testing can be avoided.

In some embodiments, a user-designed subsystem may be analyzed to determine if it includes any components that are known to violate the functional equivalence constraints. Any blocks that are unsafe to retime can be used as boundaries to define partitions within the subsystem that groups blocks together that are safe to move. The analysis can suggest to the user that the partitioned subset(s) of the system can be individually retimed. With this approach, a subsystem that would have failed retiming with prior approaches can now be successfully retimed.

In some embodiments, the system includes an Intermediate Representation (IR) generator, a functional equivalence analyzer, a partitioner, a scheduler, an optimizer/pipeline insertion engine, and a code generator such as an HDL code generator. The IR builder receives a high-level specification created by a user. The high-level program specification may be a graphical model, a Stateflow® chart, a MATLAB functions/files/scripts, a Simulink MATLAB block, C, C++, System C or other C-like code, Auto ESL, a Resistor Transistor Language (RTL) description such as VHSIC Hardware Description Language (VHDL), Verilog or the like. The IR builder may create one or more graphs or trees, such as a data flow graph (DFG), based on the high-level program specification. The DFG may include a plurality of interconnected nodes each corresponding to an operation.

The functional equivalence (FE) analyzer then scans the components of the DFG (i.e., the nodes of the DFG) to check for compliance with the necessary conditions for functional equivalence.

The partitioner may then optionally identify components of the DFG that do not pass the FE scan. These failing nodes can then be used as boundaries to partition the DFG into subsections that will individually pass the FE scan.

The scheduler then uses a scheduling algorithm to produce an optimized design for the nodes, or subsections, of the DFG that pass the FE testing. The optimized design, for example, may apply a further constraint such as register pipelining to minimize combinatorial latency for each such subsection of the DFG.

The code generator may then operate on the optimized DFG to generate optimized code.

I. High Level System Overview

FIG. 1 is a schematic illustration of an example computer system 100 for implementing and utilizing embodiments of a system for producing functionally equivalent code representing a design. The computer system 100 includes a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 includes a keyboard 116, a mouse 118 and a display 120.

The main memory 104 stores a plurality of libraries or modules, such as an operating system 122, and one or more applications running on top of the operating system 122, including a technical computing environment 124. The main memory 104 may also include a code generation system 126. The code generation system 126 may be configured as a toolbox or an add-on product to the high-level technical computing environment 124. Furthermore, a user or developer may create and store a program specification 128 and a control file 130. The control file may be stored on disk or represented in the main memory 104.

The removable medium drive 110 is configured to accept and read a computer readable medium 132, such as a CD, DVD, floppy disk, solid state drive, tape, flash memory or other medium. The removable medium drive 110 may further be configured to write to the computer readable medium 130.

Suitable computer systems include personal computers (PCs), workstations, laptops, palm computers, smart phones, tables, virtual machines, and other data processing devices, etc. Those skilled in the art will understand that the computer system 100 of FIG. 1 is meant for illustrative purposes only and that the present techniques may be used with other computer systems, processing systems or computational devices. The techniques may also be used in a networked, e.g., client-server, computer architecture, or in cloud-based environments.

Suitable operating systems 122 include the Windows series of operating systems from Microsoft Corp. of Redmond, Wash., the Linux operating system, the MAC OS® series of operating systems from Apple Inc. of Cupertino, Calif., and the UNIX® series of operating systems, among others.

As indicated above, a user or developer, such as an engineer, scientist, programmer, etc., may utilize the keyboard 116, the mouse 118 and the computer display 120 of the user I/O 106 to operate the high-level technical computing environment 124, and create the program specification 128 and the control file 130.

Suitable high-level technical computing environments for use with embodiments include the MATLAB® and SIMULINK® technical computing environments from The MathWorks, Inc. of Natick, Mass., the LabVIEW programming system from National Instruments Corp. of Austin, Tex., the Visual Engineering Environment (VEE) from Agilent Technologies, Inc. of Santa Clara, Calif., the Khoros development system from AccuSoft Corp. of Northborough, Mass., a C programming system, a JAVA programming system, and a C++ programming systems, other C environments, among still other environments. Those skilled in the art will recognize that the computer system 100 need not include any software development environment at all.

Those skilled in the art will understand that the MATLAB® technical computing environment is a math-oriented, textual programming environment for digital signal processing (DSP) design, among other uses. The SIMULINK® technical computing environment is a graphical, block-based environment for modeling and simulating dynamic systems, among other uses.

Figure 2:
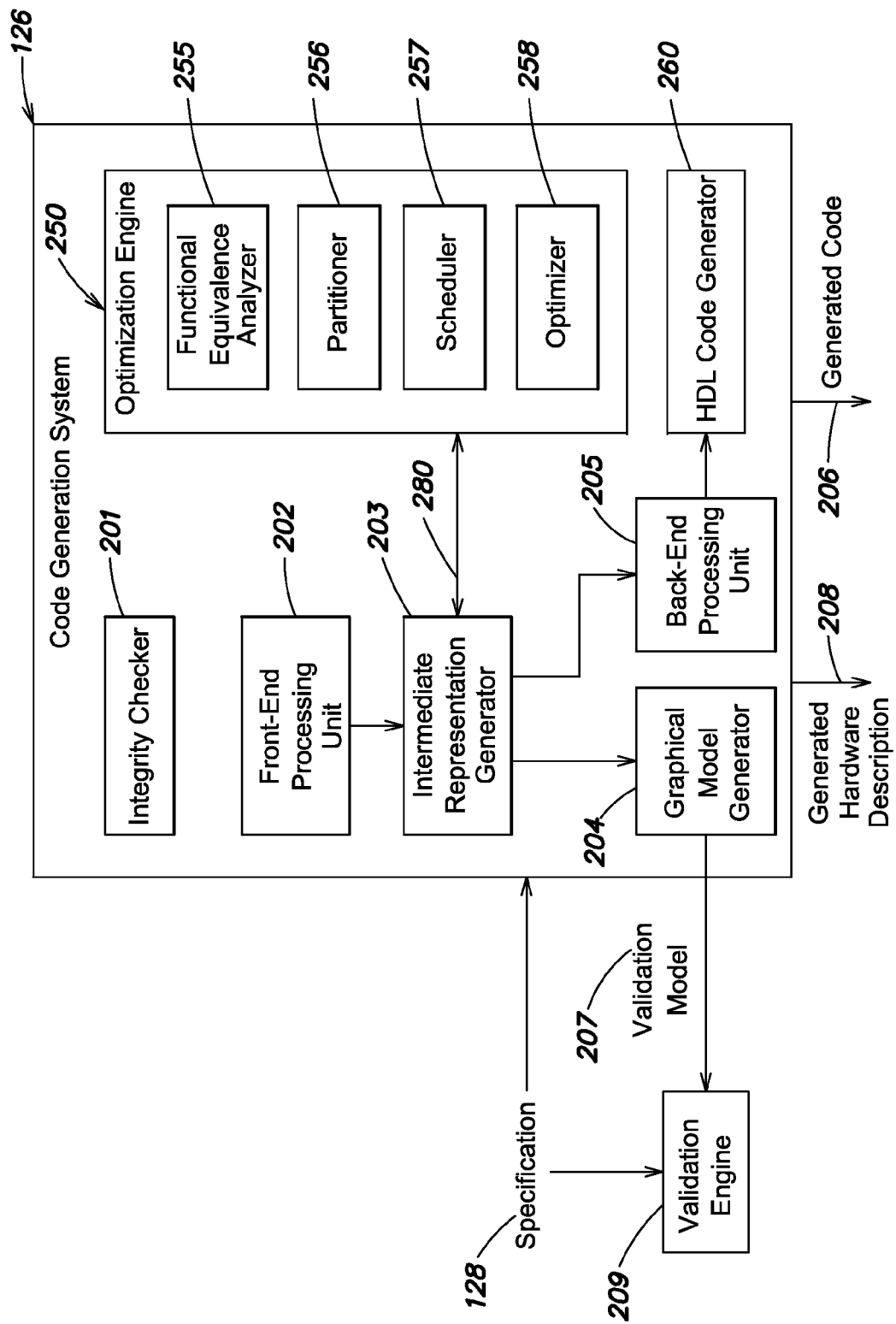
FIG. 2 is functional diagram of an example code generation environment.

FIG. 2 is a schematic block diagram of the code generation system 126. The code generation system may include an integrity checker 201, a front-end processing unit 202, an intermediate representation (IR) generator 203, a graphical model generator 204, a back-end processing unit 205, and an optimization engine 250. The code generation system 126 may receive the program specification 128 created by the user or developer with the high-level technical computing environment 124. The program specification may be a graphical model, such as a Simulink model, a block diagram a Stateflow chart, a high-level textual code listing, such as a MATLAB file, etc. The code generation system 126 may also receive the control file created by the user or developer. As described herein, the code generation system 126 may produce hardware description language (HDL) code 208, such as VHDL or Verilog code, that is optimized, e.g., through the inclusion of one or more pipelines or registers. In alternative embodiments, the code generation system 126 may produce C, C++, SystemC code or other program code 206 in any number of other languages to be run on a programmable data processor or digital signal processor, including the language of the original program specification. The code generation system 126 may also produce one or more annotated versions of the program specification 128 as a validation model 207 to be used by an external design validation engine 209.

The code generation system 126 may include a plurality of components or modules. Specifically, the code generation system 126 may include an intermediate representation (IR) generator 203 that is configured to create one or more IRs from the program specification 128.

The code generation system 126 may also include an optimization engine 250 that comprises a functional equivalence analyzer 255, a partitioner 256, a scheduler 257, an optimizer/pipeline insertion engine 258, and a Hardware Description Language (HDL) code generator 260.

The IR generator 203, functional equivalence analyzer 255, partitioner 256, scheduler 257, and the HDL code generator 260 are functions that may each comprise registers and combinational logic configured and arranged to produce sequential logic circuits. In the illustrated embodiment, these functions are software modules or libraries containing program instructions pertaining to the methods described herein, that may be stored on computer readable media, such as computer readable medium 130, and executable by one or more processing elements, such as CPU 102. Other computer readable media may also be used to store and execute these program instructions. In alternative embodiments, various combinations of software and hardware, including firmware, may be utilized to implement the principals taught herein.

II. Functional Equivalence Analyzer 255

The functional equivalence analyzer 255 accepts input as to whether the user wishes to enforce certain suggested functional constraints prior to applying component retiming constraints. To understand how the functional equivalence analyzer operates, consider first the example schematic illustration of a logical system representing a digital circuit or program code to carry out a particular function shown in FIG. 3. The representation may take the form of a graphical model (such as a data flow graph DFG) 300. As shown, the graphical model 300 may include a plurality of blocks interconnected by lines that establish mathematical or other relationships between the blocks. Lines may alternatively or additionally represent signals. Each block, moreover, may correspond to a functional element, such as a mathematical, logical, statistical, input/output (I/O) operation, filter, programming construct, such as IF-THEN-ELSE, loops, etc. The graphical model 300 may also include one or more embedded code blocks (not shown). An embedded code block allows a user to incorporate textual code into a graphical model. A suitable example of an embedded code block is an Embedded MATLAB (EML) function block from The MathWorks Inc. The EML function block supports a subset of the functions provided by the MATLAB technical computing environment. Other code blocks can originate as Stateflow charts, or other known logic or high level program specifications.

The graphical model 300 and other graphical models discussed in this document are meant for illustrative purposes only, and those skilled in the art will recognize that other models, e.g., having different types or arrangements of blocks, etc., may be created by the user. For example, in one embodiment, one or more of the graphical blocks may represent a subsystem that further comprises a plurality of interconnected blocks and/or subsystems. In still other embodiments, the model may originate in other than graphical form, such as a textural model.

Figure 3:
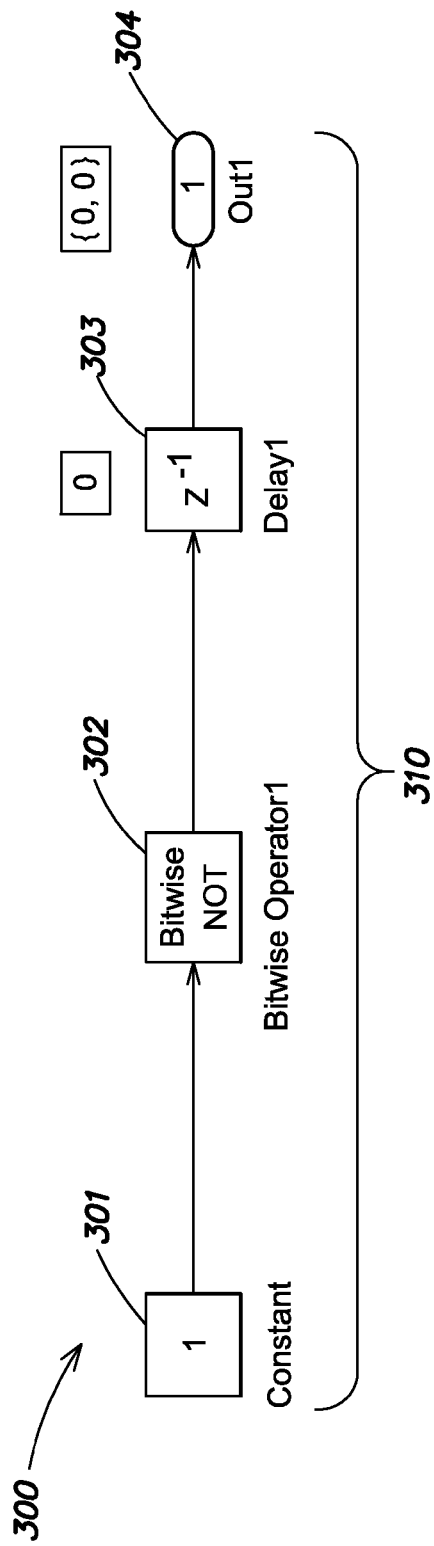
FIG. 3 is an example of a logical system representing a digital circuit or program code to carry out a function.

In the specific example of FIG. 3, the graphical model 300 includes four blocks representing a subsystem 310 made up of four elements: an input signal block 301 (constant), a bitwise NOT operator 302, a delay register ($z^{-1}$) 303 and an output block 304. The subsystem 310 applies the bitwise NOT operation to the input signal and adds a one cycle delay.

The basic process of retiming the graphical model 300 can involve moving delay blocks, such as the $z^{-1}$ delay block 303 in the data flow. In the example shown in FIG. 4A, a retimed graphical model 320 is generated by retiming the graphical model 300 by moving the $z^{-1}$ delay block 303 from a position after the bitwise NOT operator 302 to a position before the bitwise NOT operator 302. The retimed graphical model 320 also replaces the $z^{-1}$ delay block 303 with another delay block $z^{-d}$ 306. It may be the case, that for example, a retiming analysis indicates that by moving the delay block in this way, the overall system is improved.

Figure 4A:
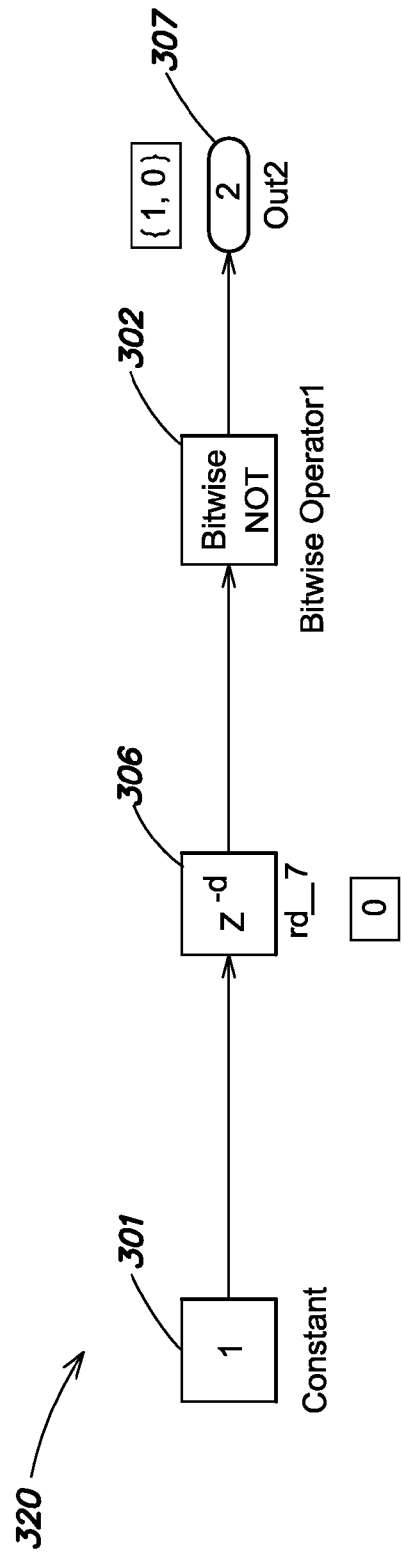
FIG. 4A is an example retimed circuit.

With the particular example in FIG. 4A, however, a functional equivalent retimed model 320 will not result. More particularly, the graphical model 300 (FIG. 3) provides a zero output in the first clock cycle, due to an initial zero condition of the delay block 303, and then another zero output when a constant logic one is applied to the input on the second clock cycle (this value sequence is indicated by a {0,0} notation next to the output block 304). This result is because an initial output of the delay block 303 is zero (as indicated by the numeral "0" in the box next to block 303). However, the output 307 of the retimed model output 320 for the first two clock cycles is {1,0} since the initial output of the moved delay block $z^{-d}$ 306 is zero. A logic one is thus output in a first clock cycle before providing a zero output in the second clock cycle in the retimed model of FIG. 4A. Therefore, the retimed graphical model 320 is not an exact functional equivalent to the original graphical model 300.

The approach of some embodiments is to ensure that the transformed component model has the same functionality across clock cycles. This functional equivalence requirement can be applied as a constraint prior to applying retiming constraints.

Figure 4B:
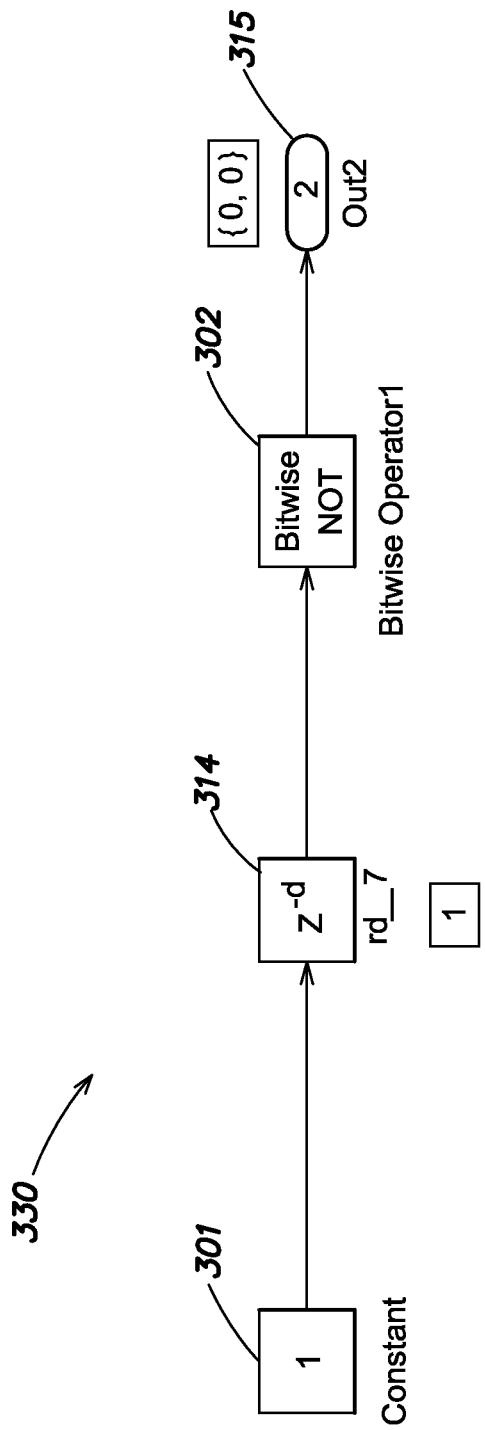
FIG. 4B is another example retimed circuit.

One might consider that a possible solution here is presented by the circuit 330 of FIG. 4B where the delay block 303 is replaced with a delay block 314 that is designed to force a logic one {1} as an initial condition (as indicated by the numeral "1" shown next to block 314). If that is done, an equivalent initial state can be provided to the circuit and functional equivalence results so that output 315 exhibits the same behavior as output 304 in graphic model 300. However, this approach requires some modification to the logic of the original circuitry. While this example is somewhat simple, more complicated circuits may not easily lend themselves to this type of redesign. Furthermore, it can be shown that solutions to this problem, involving backwards justification of initial states, can become a non-deterministic, polynomial-time hard (NP hard) problem with limited solutions.

Figure 5A:
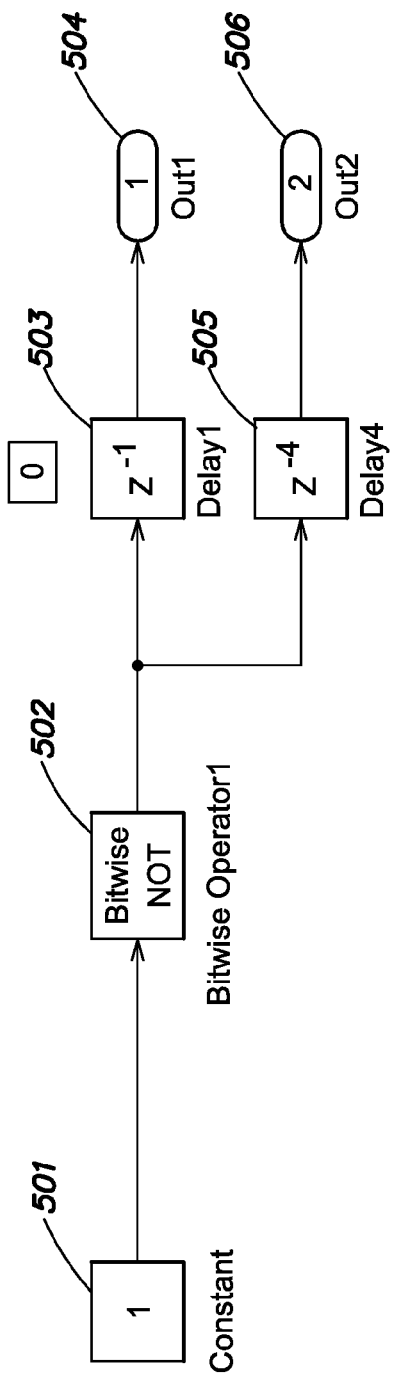
FIGS. 5A and 5B are still other example circuits.
Figure 5B:
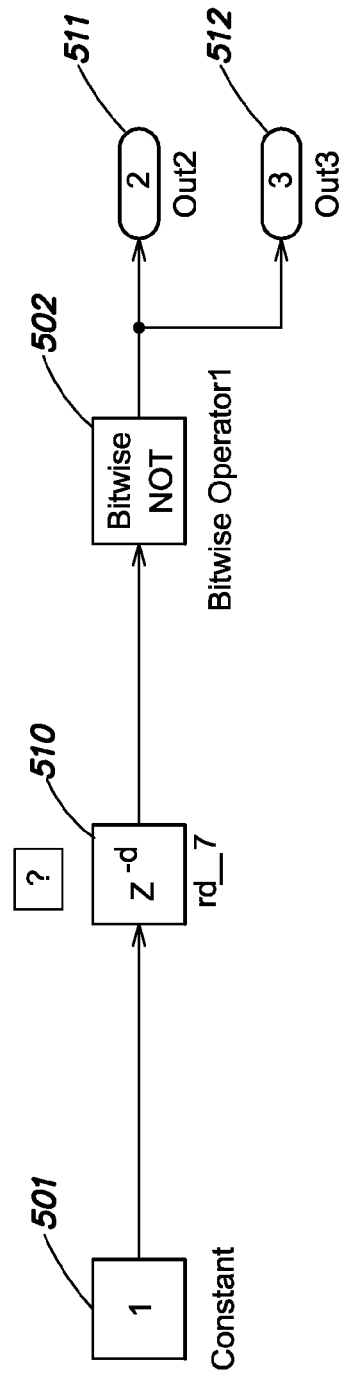
Figure 6:
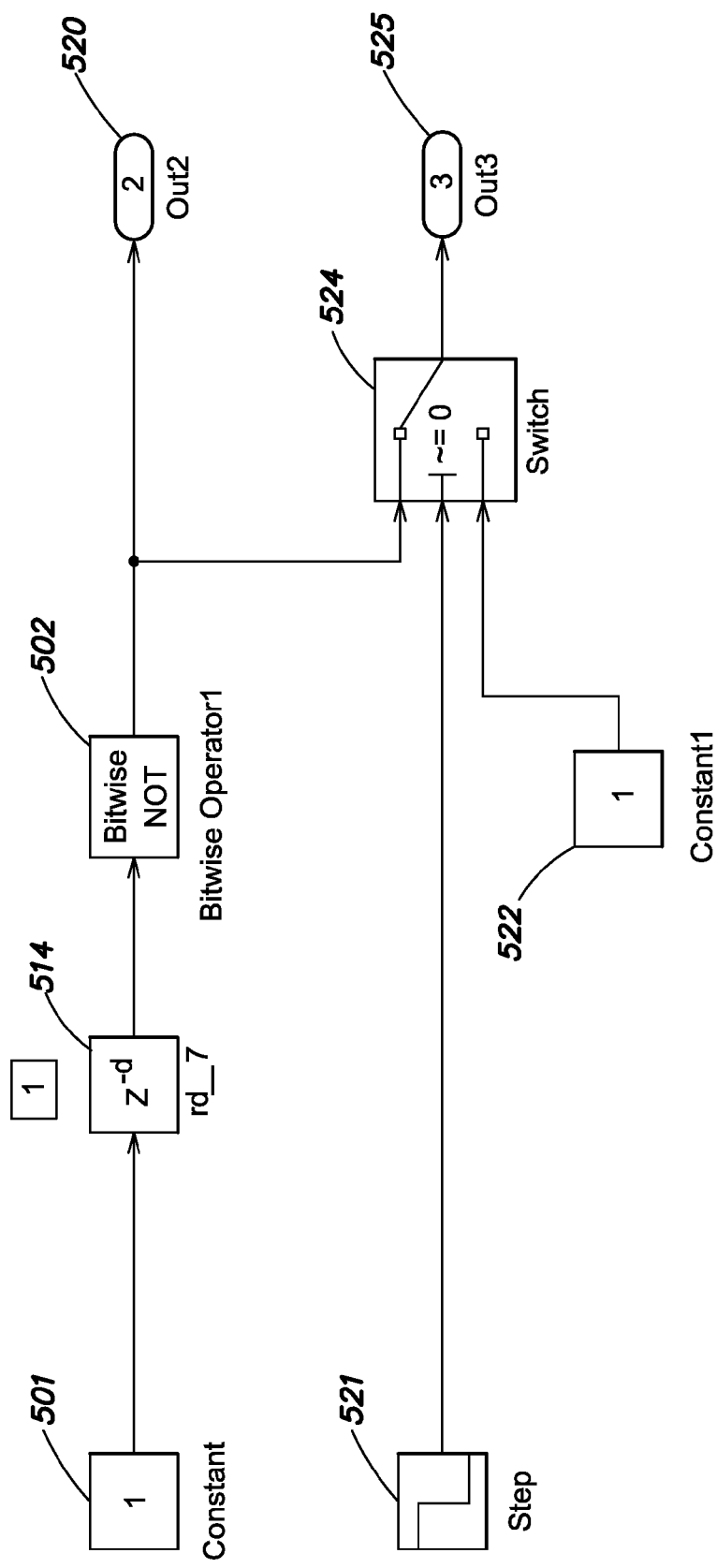
FIG. 6 is another example circuit.

In another situation, it may even be impossible to redesign the circuit as an equivalent initial state can be provided. Consider the example of FIG. 5A. In this graph, a bitwise NOT operation 502 feeds a pair of delay blocks ($z^{-1}$ 503 and $z^{-4}$ 505) operating in parallel, providing {0} and {1} as respective initial output states. It is possible that an optimized circuit could be provided by instead using a single delay 510 that is moved to a position prior to the bitwise NOT operation, as suggested in FIG. 5B. However this solution will not work, as it results in an impossible equivalent initial state problem for the repositioned delay block 510. One remedy here might be to add additional functional elements to the circuit such as shown in FIG. 6. As one example, this could be provided by adding a switch 524 with a step input control 521. The FIG. 6 circuit is then functionally equivalent to that which was shown in FIG. 5A. However, this solution introduces additional logic components thereby becoming a less than ideal solution.

A more desirable solution enabled by some embodiments is to still allow for register re-timing by moving delays in the circuit around but by first applying functional equivalence as a top priority constraint. This approach provides that one does not introduce a different result by moving the delay blocks around. Once functional equivalence is confirmed, then the automated design tool can apply more constraints such as minimizing and/or reducing the retiming.

Two additional constraints are applied in some embodiments: that no additional logic should be introduced into the model, and that the functional equivalence method should be capable of being performed quickly.

FIGS. 7A and 7B represent a graphical view of an example constraint that may be applied to check for functional equivalence. In this example, retiming is performed by moving a delay block 703 across a functional block f(x) 702 that includes only combinatorial logic. Specifically the functional block f(x) 702 is entirely composed of combinational logic. As part of functional equivalence testing, operation of the functional block f(x) 702 can be checked to determine the effect of moving the delay block 703 from an output side to an input side.

A first property to check is to determine whether an initial condition of a retimed circuit provides an initial value of zero for internal states of the function y(t)=f(x(t)).

A second condition to test is whether a zero input to the retimed graph component produces a zero output value, e.g., {f(0)}=0.

Figure 8A:
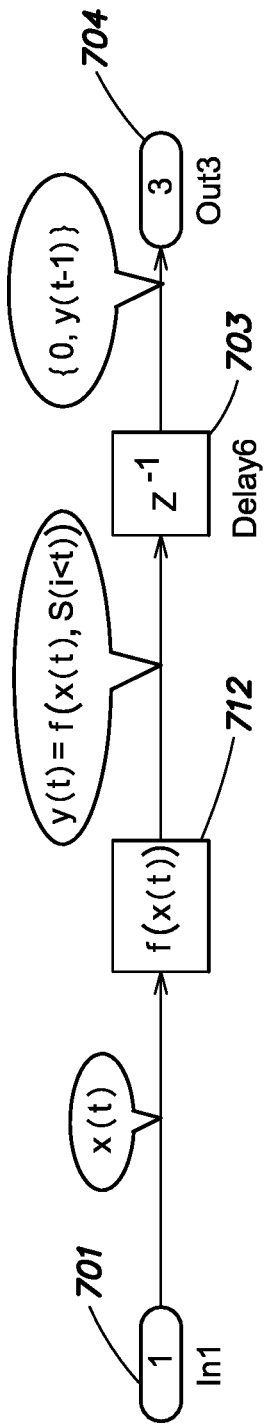
FIGS. 8A and 8B are graphical views of an example constraint.
Figure 8B:
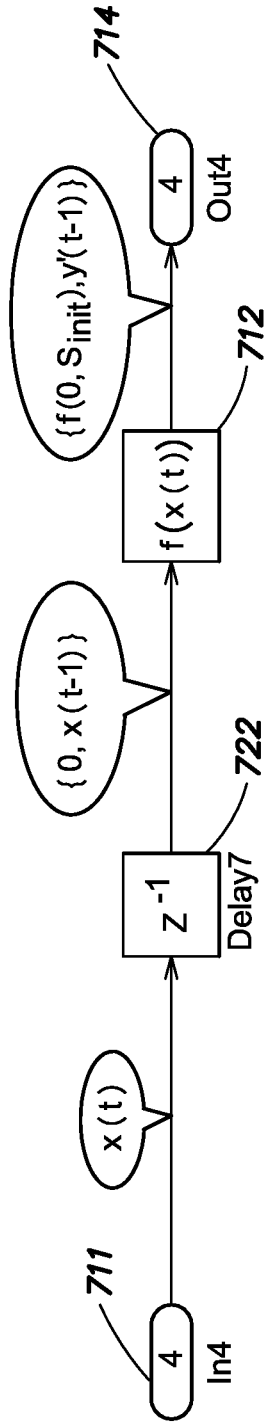

FIGS. 8A and 8B represent a third constraint that can be tested for when the delay component 703 is moved across a component function f(x) 702 resulting in a retimed delay 722. Here, component function 702 may itself contain states, such that $$<y(t),S(t)>=f(x(t),S(i<t))$$

This will typically be the case for component functions f(x(t)) 702 where the logic is not strictly combinatorial, e.g., where the component function 702 may assume different internal states S(t). The property to check for such a condition is $$f(0,S_{init})=<0,S_{init}>, \text{if 0 is the initial value in the delay being moved}$$

or in other words, the test is whether applying a logic 0 to the input does not change the component's 702 state.

Figures 9, 10:
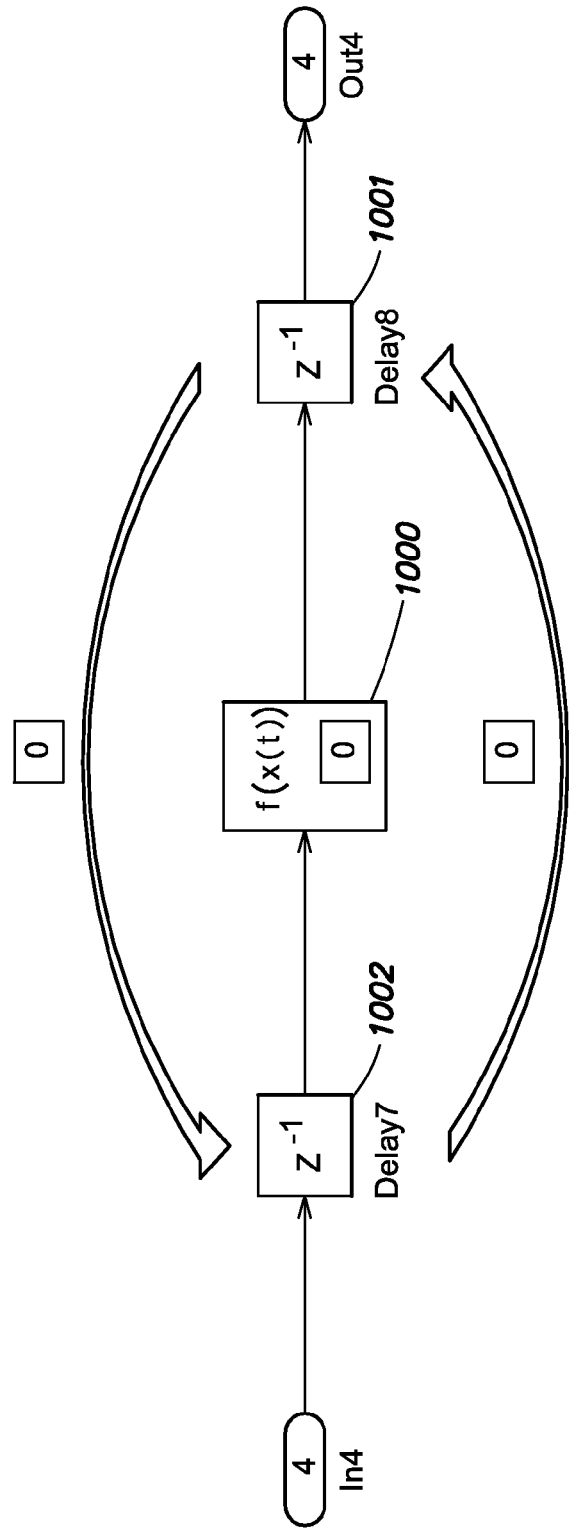
FIG. 9 is an example data structure storing an example list of conditions.
FIG. 10 is a graphical depiction of the conditions of FIG. 9.

FIG. 9 lists these three possible conditions to conclude functional equivalence retiming is possible for any arbitrary function. In particular the following things may be checked:

1. whether the component has an initial value of zero for its internal state(s) {InitVal=0} (901);
2. whether applying zero at the input produces zero at the output {f(0)=0} (902); and
3. whether applying a 0 at the input does not change the component's state (the component could have conflicting internal states as long as the external state does not change) (903).

These conditions can be graphically depicted as in FIG. 10, where a component 1000 is the logic function being tested, and delay blocks 1001 and 1002 are being evaluated for possible retiming.

If at least two or more of these tests are true, the component 1000 is a viable candidate for further optimization, such as retiming by moving the delay components 1001, 1002 backward or forward in the pipeline. However, in some embodiments, it can be concluded that retiming is not possible for a component 1000 if the test for one or more of the above conditions is negative, or unknown.

For example, a user may set code generation options so that the model may be optimized by implementing retimed pipelines (e.g. via the pipeline insertion engine 258) where multiple instructions or operations are overlapped in time. The involves reconsidering the placement of registers to break up computation into multiple units and executing a scheduling algorithm to produce a revision to the original graph.

Figure 11:
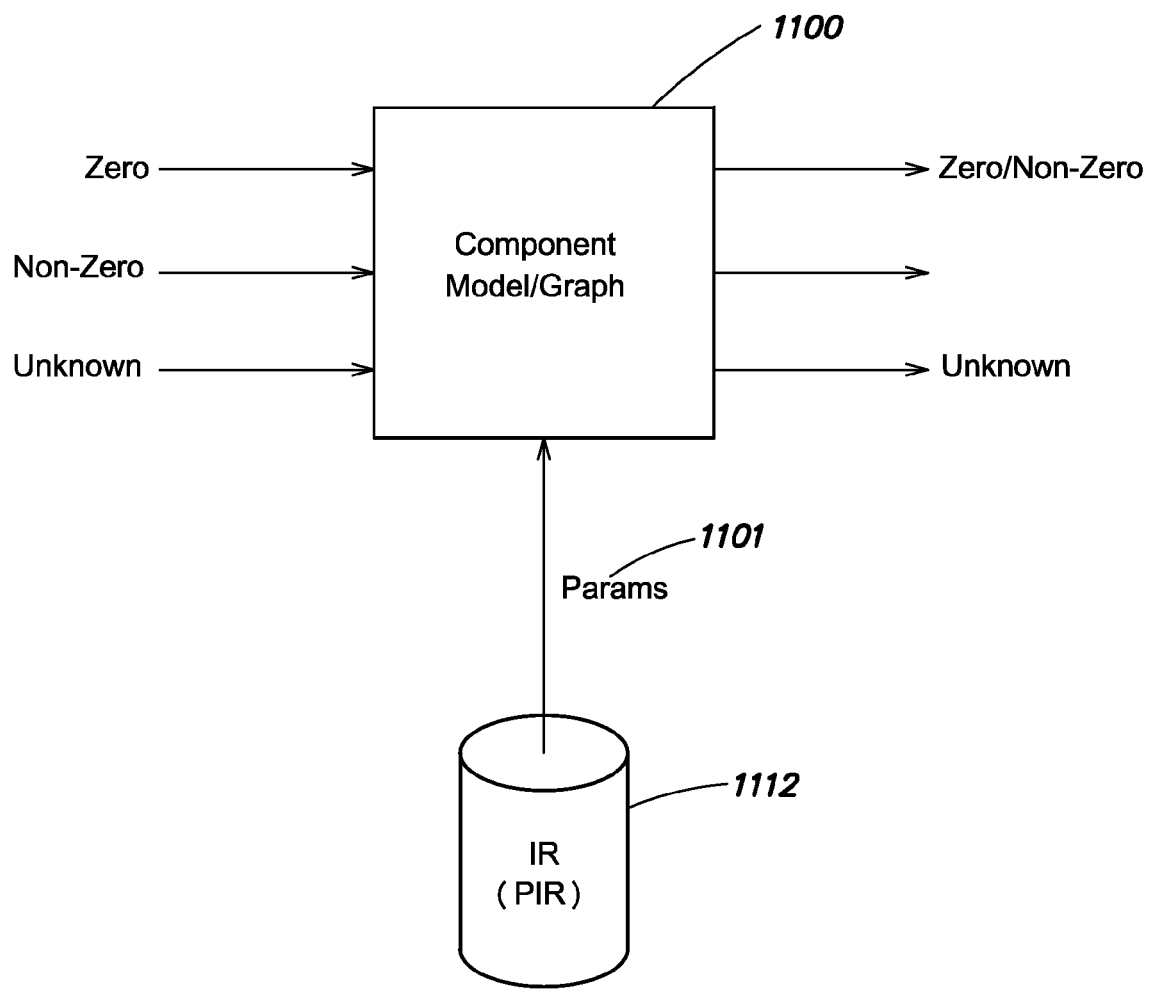
FIG. 11 is a high-level depiction of logic to implement functional equivalence analysis.

FIG. 11 is a high level depiction of logic for implementing functional equivalence (FE) analysis 255. The figure shows a model 1100 of a component in question, as well as any parameters 1101 for determining how the component operates. The model 1100 includes a description of the component, initial condition logic of the component, state information, and input parameters. This information can be accessible in a design tool environment via an intermediate representation (IR) model such as may be provided by an IR component database 1112. The IR may be a Parallel Intermediate Representation (PIR).

The FE analysis 255 can access the component model 1100 and examine a behavior of the model 1100. In some embodiments, the FE analysis 255 need not apply an exhaustive set of inputs, for example, inputs can be restricted, such as to zero, non-zero, and unknown input states. In some embodiments, output testing can also be restricted, such as for zero, non-zero, and unknown output states.

The first condition is the initial value zero test. This may be checked by examining the component model 1100 to determine its initial specified value(s). It should be understood that if the component model 1100 contains a further sub-graph with multiple elements that may specify initial states, then the initial states values of all of such sub-graph elements may be checked.

The second condition, that is, whether applying a zero at the input results in zero at the output, may be determined by exercising the component model 1100 and observing a response to a zero input.

Figure 12:
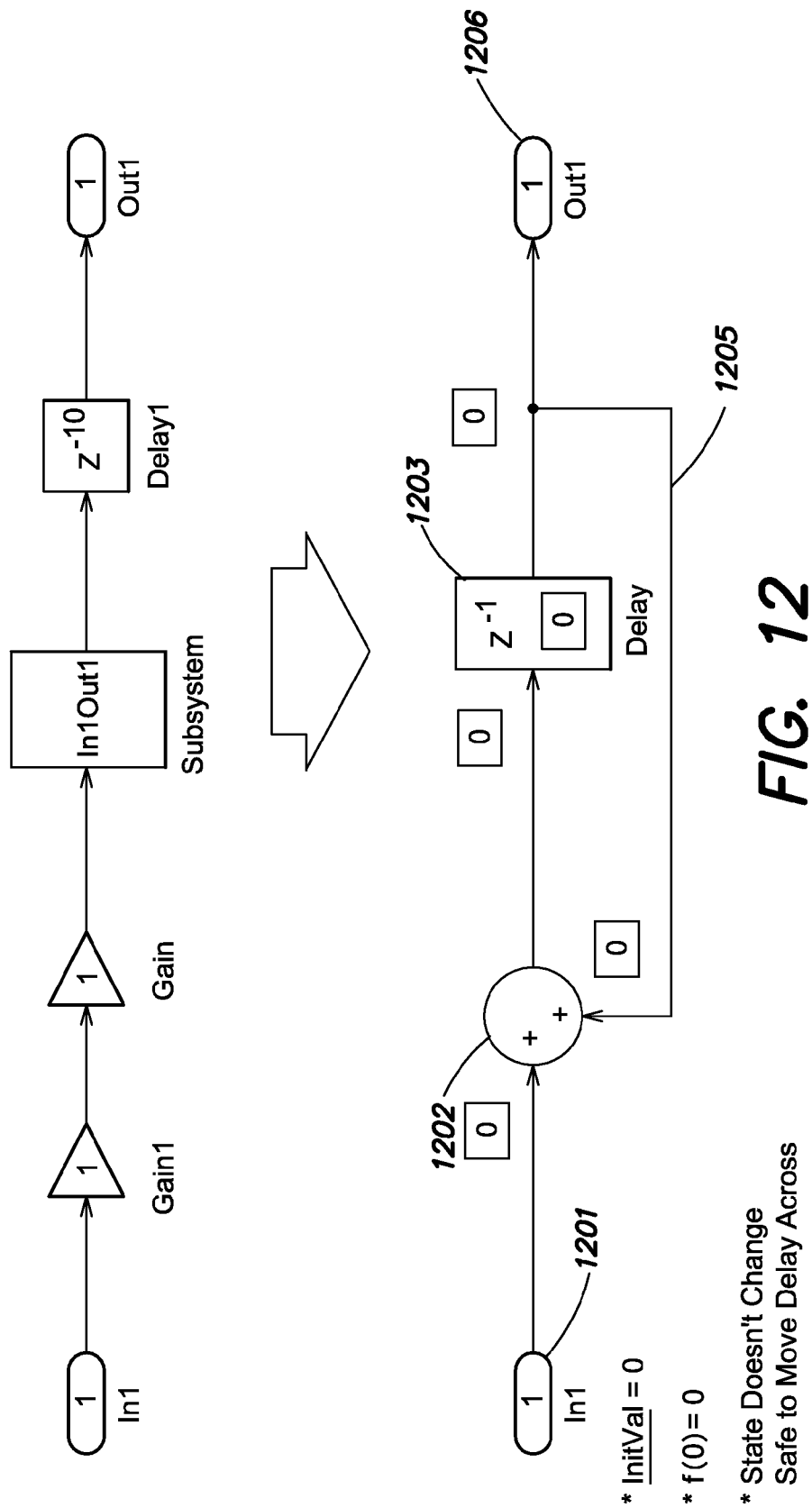
FIG. 12 is an example of an analysis for the conditions of FIG. 9.

Testing for compliance with three conditions may include knowing or analyzing the semantics of each component model 1100. A suitable initial value propagation process in FIGS. 12 and 13 may use computer techniques, such as constant propagation optimization, to check compliance with this constraint. In some embodiments, complete semantic analysis of the component is not required. In that case, determining if the component internal states do not change with a zero input may be sufficient.

For components made up entirely of static circuit elements, the analysis results for the three tests may be known in advance. The known analysis results may be stored with a model of the component to expedite the analysis for possible retiming. For example, a simple gain block is known in advance to pass all three tests, since a gain block has an initial zero value, produces zero output with zero input, and does not assume internal logic states. However, for other components, such as a counter, it is known in advance that such components will fail the second and third condition (because, for example, a counter will possibly automatically change state and advance to a next value on a next clock cycle, regardless of input values).

The logic for FE analysis 255 may also automatically presume that a user-designed block will not pass the three tests and mark the user-designed block accordingly.

More generally, a CompRoughSemantics process may perform an initial value propagation analysis, using the component model 1100, to determine whether the component results in any state changes. An example of how that process performs this analysis for the third condition is described in connection with FIG. 12. Here the example component is a subsystem that consists of an adder 1202 and a delay 1203 with feedback 1205 to the adder. The component passes the initial value equal zero {InitVal=0} and zero input results in zero output {f(0)=0} tests, such as via initial constant value propagation. The third test is then performed by propagating the initial value zero through the various nodes of the graph. Here it is seen that a logic zero value applied at the input does not result in any state change, in either the adder 1202 or the delay 1203 component within the subsystem. Therefore it is safe to conclude that moving delay $z^{-10}$ 1203 from the output to the input produces a functionally equivalent design.

Figure 13:
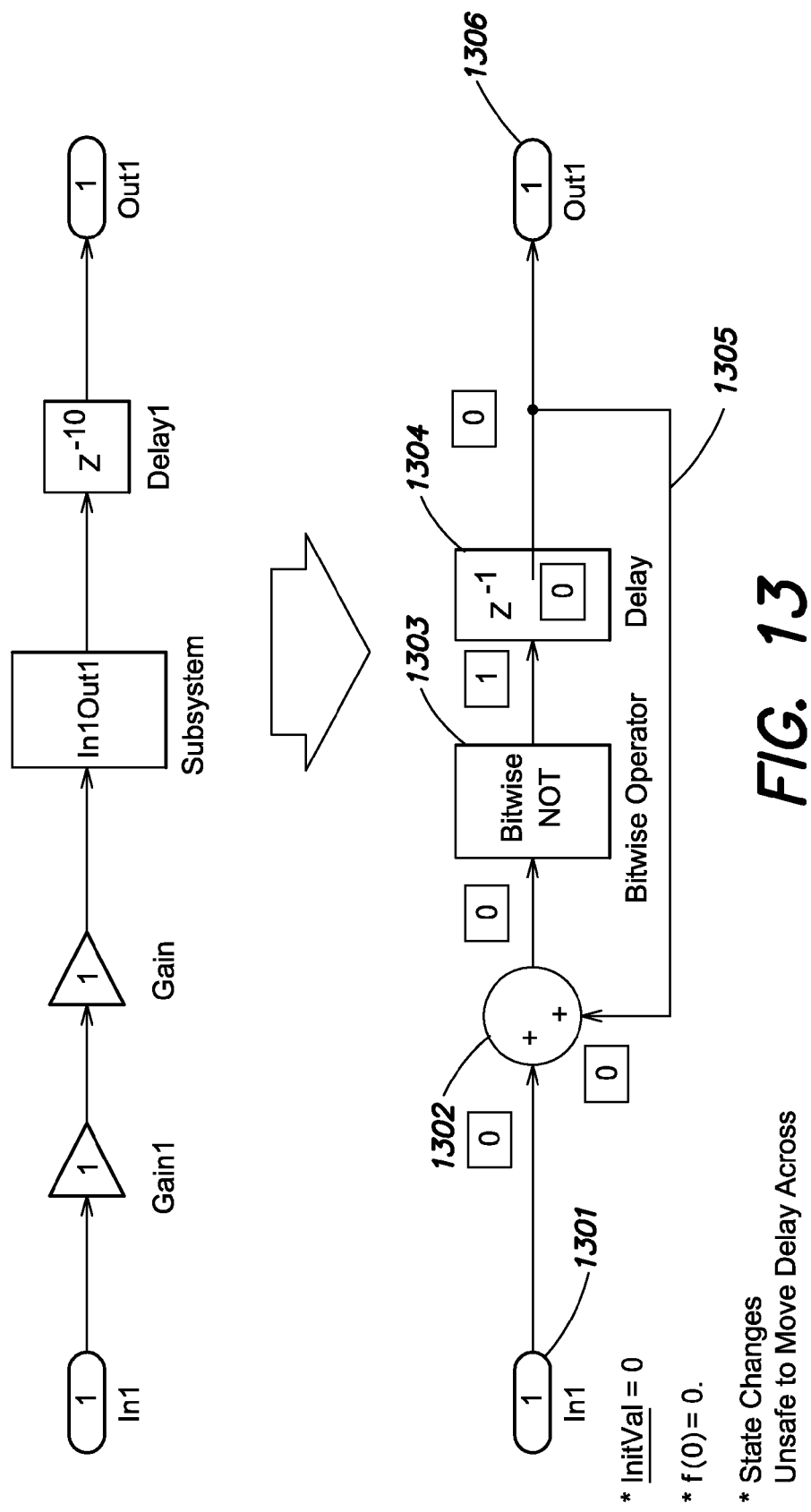
FIG. 13 shows an example system.

However, with another example, that shown in FIG. 13, the result is different. The component here is a subsystem that includes an adder 1302 and delay 1304 as in FIG. 12, but which adds a bitwise NOT 1303 operation in a forward path.

While the component passes the InitVal=0 and f(0)=0 tests, initial value propagation analysis indicates failure of the third condition. Specifically, when applying zero to the input, the bitwise NOT 1303 inverts the input to the delay 1304, and as a result, also affects a feedback loop 1305. This causes a state change in the adder output. Therefore, a state change occurs with this component and thus, it is not safe to move the delay block across the bitwise NOT operator, and this circuit should not be re-timed.

If the component being analyzed comprises one or more user-defined circuit blocks or functions, in some embodiments, FE analysis 255 may automatically presume that it will violate at least one of the three rules for functionally equivalent testing.

The FE analysis 255 may be relatively simple. The first two conditions are straightforward input and output checks of the component graph. The analysis for compliance with the third condition may also be simple. For example, if there are no state blocks in the graph then the third constraint may be presumed to pass. And if there are state blocks in the component under analysis, it may then be submitted to semantic value propagation testing. In addition, only zero, nonzero and unknown states may be applied in the semantic testing.

It is possible in some implementations that the InitVal and f(0) tests could use other values to determine functional equivalents. Thus, these tests could be generalized to InitVal=K and f(x)=x. However, it may become more difficult to design components for the generalized InitVal condition (in some embodiments, components assume a zero initial condition value). It may also be difficult to ensure components also provide a given output when given the same input—indeed the problem may become an NP hard problem, for example, to ensure operating conditions are guaranteed to produce an expected result other than a zero output.

III. Using FE Analysis 255 to Suggest Subsystem Partitioning (Partitioner 256)

Next is described the operation of the partitioner (element 256 in FIG. 2), which uses the results of functional equivalence (FE) analysis 255 to partition a design into groups of components or nodes that can each be submitted to subsequent retiming of the graph.

Figure 14:
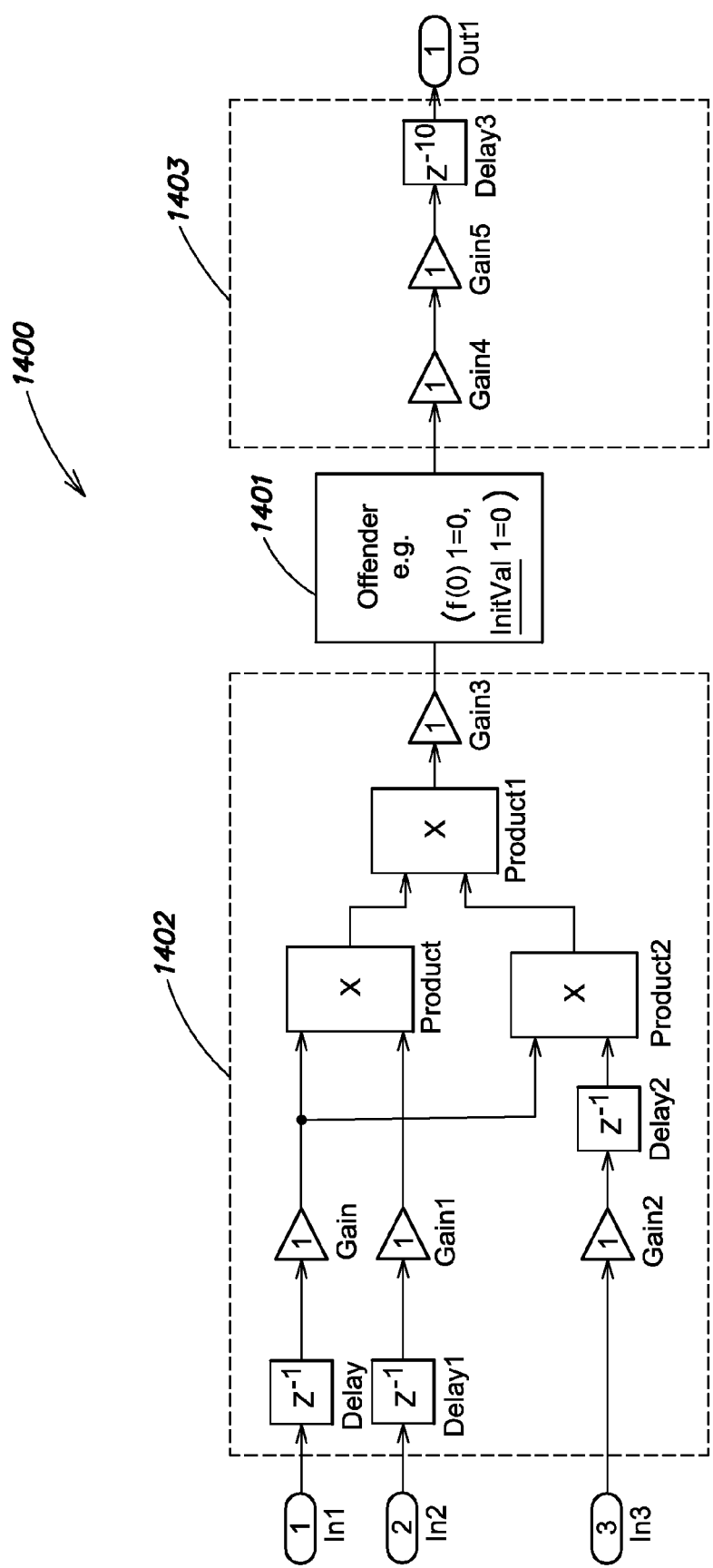
FIG. 14 illustrates an example for dividing a system.

In an example shown in FIG. 14, FE analysis 255 has indicated that an "offender" function 1401 does not pass. In some embodiments, the presence of the offender function 1401 may prohibit retiming of an entire subsystem 1400. As a result, nothing is retimed in such a subsystem. However, many other components in the subsystem 1400, a group 1402 of components to the left of the offending block 1401 and a group 1403 of components to the right of the offending block 1401, do meet all three conditions.

In some embodiments, a concept of fine partitioning is applied. In fine partitioning, partitions with components for which it is safe to move the delay across are created. In effect, offending blocks such as the offending block 1401 become boundaries that divide the subsystem 1400 into one or more new graphs that do exhibit functional equivalence and therefore can individually be retimed. In the example of FIG. 14, the group 1402 of components to the left of the offending block are thus grouped together and retimed separately from the group 1403 of components to the right of the offending block. The offending block 1401 is left alone and not retimed.

Fine partitioning permits improving subsystems 1400 that have only some components fail the FE test. Fine partitioning also reduces the retiming complexity as a graph with E edges and V nodes to ($\sim O(V \cdot E \cdot \log E)$). The approach may work on a smaller graph by excluding non-functional equivalent components, thus reducing time, as V and E become smaller.

Figure 15:
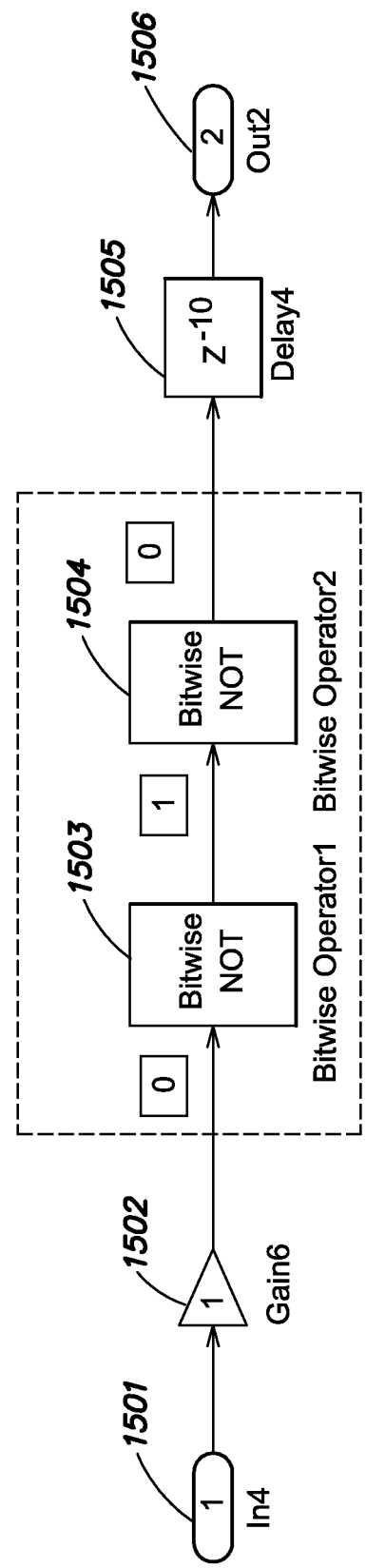
FIG. 15 is an example of a user-applied change to a component model.

In another example illustrated in FIG. 15, a pair of bitwise NOT operators 1503, 1504 have been grouped to ensure the f(0)=0 condition is met. In this case, it may be possible for the user to redesign the subsystem after seeing that the subsystem has failed to pass the FE compliance test.

IV. Example Model and Retimed Model

Figure 16:
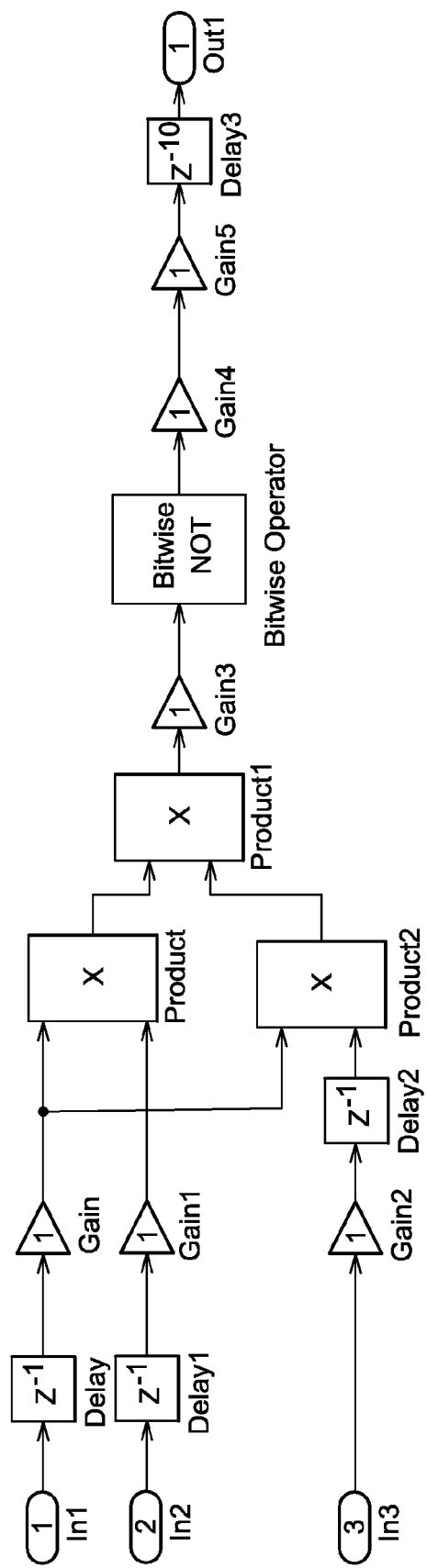
FIGS. 16-18 illustrate example models.
Figure 17:
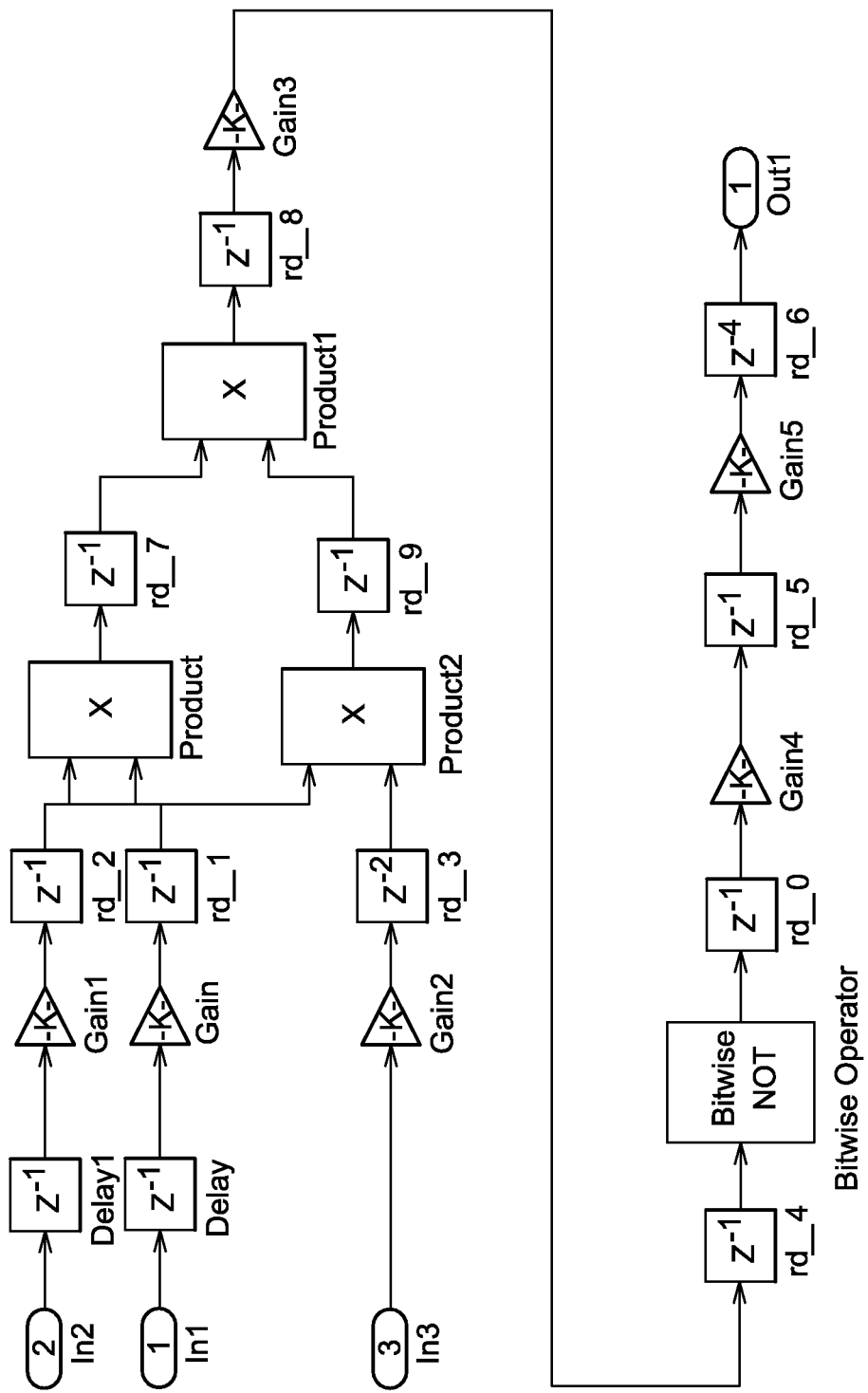
Figure 18:
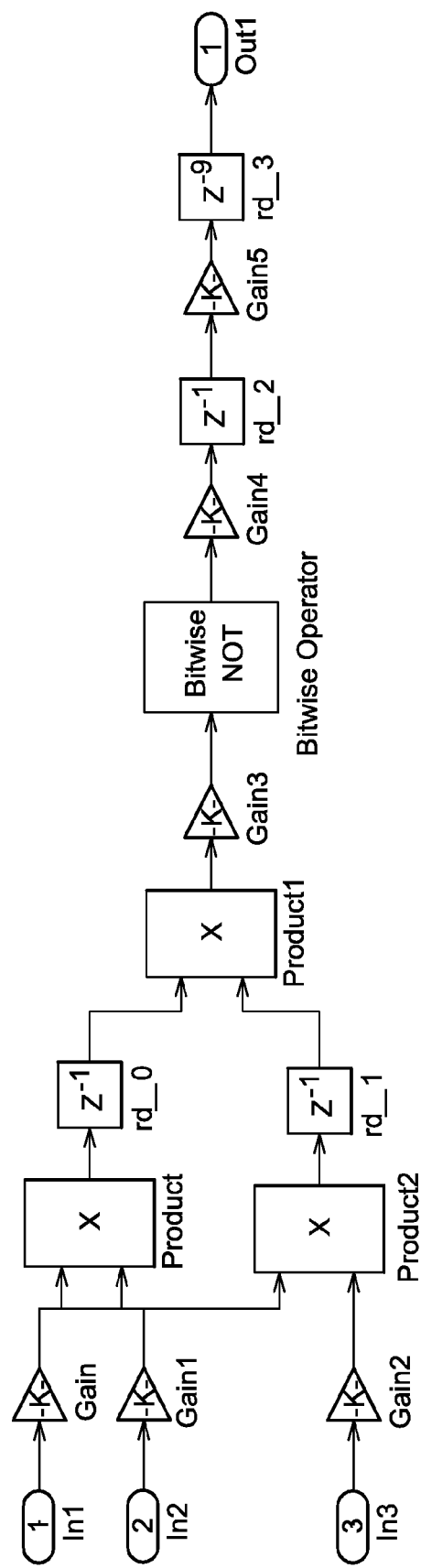

FIG. 16 is an example initial graph for a subsystem that implements part of a digital signal processing function. FIG. 17 is the initial graph retimed without first applying the FE constraints described above. FIG. 18 is the retimed graph but with FE constraints applied before the retiming. Note that when FE constraints are first applied, the resulting model is not only simpler but also includes fewer delays.

V. Further Considerations

As described herein, embodiments of the system and method can apply functional equivalence as a primary constraint in implementing a high-level design specification. In some embodiments, only if these functional equivalence constraints are met are further optimizations, such as retiming, applied.

While what has been described as an example is a way to generate an HDL description to be implemented in hardware such as a field programmable gate array or application specific integrated circuit, it should be understood that the same techniques can be used to generate other things, such as program code (such as C code) to be executed on a programmable processor, from a high level description.

Alternative embodiments may use various techniques to split a program for execution on multi-core processors or to create a multi-threaded process or program from a single-threaded process or program.

The foregoing description has been directed to example embodiments. It will be apparent, however, that other variations and modifications may be made to the described embodiments, with the attainment of some or all of their advantages. Therefore, it is the object of the appended claims to cover all such variations and modifications as come within the true spirit and scope of this patent.

What is claimed is:

1. A method comprising:
    building, on a computer, at least one intermediate representation (IR) including a specification for one or more components and a plurality of interconnections between the one or more components;
    storing the at least one IR in a memory;
    analyzing, on the computer, the at least one IR, the analyzing comprising at least two of:
        determining a first condition of whether a first of the one or more components has a predetermined initial state;
        determining a second condition of whether the first of the one or more components produces an expected output value given an input value; or
        determining a third condition of whether the first of the one or more components produces no state change for a selected input value; and
    if at least two of the first, second or third conditions are determined to be true, then rearranging, on the computer, at least one of the plurality of interconnections or at least one of the one or more of the components in the at least one IR.

2. The method of claim 1 wherein
determining the first condition further comprises:
    determining whether the first of the one or more components has a zero initial state value; and determining the second condition further comprises:
determining whether the first of the one or more components produces a zero output value from a zero input value.

3. The method of claim 1 wherein the rearranging further comprises:
retiming an execution order of the first of the one or more components in the at least one IR.

4. The method of claim 3 wherein the retiming comprises:
scheduling an execution order of the one or more components in the at least one IR, wherein each of the one or more components is scheduled to execute in a given stage of a pipeline where stages of the pipeline are defined by two or more registers in the at least one IR.

5. The method of claim 1 wherein the analyzing further comprises:
determining a fourth condition of whether a second of the one or more components has a predetermined initial output value; or
determining a fifth condition of whether the second of the one or more components produces an expected output value given an input value; or
determining a sixth condition of whether the second of the one or more components produces no state change for a selected input value; and
wherein the rearranging further comprises:
if at least two of the fourth, fifth, and sixth conditions are determined to be true, then using the second of the one or more components as a boundary for partitioning the at least one IR into two or more partitioned portions.

6. The method of claim 5 additionally comprising:
analyzing, on the computer, at least one of the partitioned portions, the analyzing comprising:
determining seventh condition of whether if a component in the partitioned portion has a predetermined initial output value; or
determining an eighth condition of whether the component in the partitioned portion produces an expected output valve given an input value; or
determining a ninth condition of whether the component in the partitioned portion produces no state change for a selected input value; and
if at least two or more of the seventh, eighth and ninth conditions are determined to be true, then rearranging the at least one component or at least one connection between components in the at least one partitioned portion.

7. The method of claim 1 additionally comprising:
generating Hardware Description Language (HDL) code or C code based on the at least one IR.

8. The method of claim 1 further comprising:
receiving the at least one IR from a code generator.

9. The method of claim 1 wherein the analyzing further comprises:
computing semantics of the first of the one or more components by executing a time based block model of the first of the one or more components, or by using a compiler technique.

10. An apparatus comprising:
an Intermediate Representation (IR) receiver, for receiving an IR that comprises a functional model that includes representations of at least two components and interconnections between the components;
a memory, for storing the IR; and
a processor, for executing program code for a functional equivalence analyzer, the program code for accessing the memory to read the IR and to determine if at least one component in the functional model
(a) has a predetermined initial state; or
(b) produces an expected output value given an input value, or
(c) produces no state change for a selected input value; and
if at least two of (a), (b) and (c) are determined to be true, then the program code further rearranging the at least one component or at least one of the interconnections in the IR.

11. The apparatus of claim 10 wherein the program code for the functional equivalence analyzer further determines if the at least one component:
(a) has a zero initial state value; and
(b) produces a zero output value from a zero input value.

12. The apparatus of claim 10 wherein the program code additionally comprises:
an optimizer, for retiming an execution order of the components within the IR.

13. The apparatus of claim 12 wherein the IR includes a pipeline with stages defined by two or more registers in the IR and the optimizer further:
schedules an execution order of components in a given pipeline stage.

14. The apparatus of claim 12 wherein the optimizer further:
receives an input identifying a component for which the functional equivalence analyzer determined that at least two of (a) (b) and (c) were not true;
partitions the IR prior according to the identified component to identify a first partition and a second partition of the functional model; and
retimes an execution order of the first partition independently from retiming an execution order of the second partition.

15. The apparatus of claim 14 wherein the processor executing the program code for the functional equivalence analyzer additionally determines if at least one of the partitioned portions:
has a zero initial state value; or
produces an expected output value given an input value; or
produces no state change for a selected input value.

16. The apparatus of claim 10 wherein the IR receiver further receives the intermediate representation from a code generator.

17. The apparatus of claim 10 wherein the IR is used by the processor to generate Hardware Description Language (HDL) code or C code.

18. The apparatus of claim 10 wherein the processor executing the program code for the functional equivalence analyzer further:
determines semantics of the component by executing a model of the component, or by using compiler techniques for constant propagation or conditional constant propagation.

19. A non-transitory computer readable medium comprising instructions executable by a computer, the medium comprising:
instructions to build one or more intermediate representations (IRs) of a functional specification, at least one IR including a plurality components and a plurality of interconnections between the components;
instructions to store the at least one IR in a memory;
instructions to analyze the at least one IR to determine if conditions for at least one component therein include at least two of:

(a) having a predetermined initial output value;
(b) producing an expected output value given an input value; or
(c) producing no state change for a selected input value; and instructions to rearrange at least one connection or the at least one component in the IR, if at least two of the three conditions (a), (b) and (c) are determined to exist for the component by the instructions to analyze.

20. The non-transitory computer readable medium of claim 19 further comprising instructions to analyze if conditions for the at least one component comprise:

having a zero initial state value; or whether the first of the one or more components produces a zero output value from a zero input value.

21. The non-transitory computer readable medium of claim 19 further comprising instructions to compute semantics of the one or more components by executing a time based block model or by using a compiler technique.

22. The non-transitory computer readable medium of claim 19 further comprising instructions to determine a fourth condition of whether a second of the one or more components has a predetermined initial output value; or determine a fifth condition of whether the second of the one or more components produces an expected output value given an input value; or determine a sixth condition of whether the second of the one or more components produces no state change for a selected input value; and if at least two of the fourth, fifth, and sixth conditions are determined to be true, then to the second of the one or more components as a boundary for partitioning the at least one IR into two or more partitioned portions.

23. The non-transitory computer readable medium of claim 22 further comprising instructions to analyze at least one of the partitioned portions, to further:
determine a seventh condition of whether if a component in the partitioned portion has a predetermined initial output value; or
determine an eighth condition of whether the component in the partitioned portion produces an expected output valve given an input value; or
determine a ninth condition of whether the component in the partitioned portion produces no state change for a selected input value; and if two or more of the seventh, eighth and ninth conditions are determined to be true, then to rearrange the at least one component or at least one connection between components in the at least one partitioned portion.

24. The non-transitory computer readable medium of claim 19 further comprising instructions to generate Hardware Description Language (HDL) code or C code based on the at least one IR.

* * * * *